United States Patent
Cheng et al.

(10) Patent No.: US 9,608,021 B2
(45) Date of Patent: Mar. 28, 2017

(54) IMAGE SENSOR AND METHOD FOR MANUFACTURING THEREOF

(71) Applicant: TAIWAN SEMICONDUCTOR MANUFACTURING CO., LTD., Hsinchu (TW)

(72) Inventors: Yun-Wei Cheng, Taipei (TW); Zhe-Ju Liu, Pingzhen (TW); Kuo-Cheng Lee, Tainan (TW); Chi-Cherng Jeng, Tainan (TW); Chun-Hao Chou, Tainan (TW); Yin-Chieh Huang, Tainan (TW); Wan-Chen Huang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 1 day.

(21) Appl. No.: 14/080,611

(22) Filed: Nov. 14, 2013

(65) Prior Publication Data

US 2015/0130002 A1    May 14, 2015

(51) Int. Cl.
*H01L 27/146* (2006.01)
(52) U.S. Cl.
CPC .. *H01L 27/14621* (2013.01); *H01L 27/14627* (2013.01); *H01L 27/14629* (2013.01); *H01L 27/14685* (2013.01)
(58) Field of Classification Search
CPC . H01L 27/146; H01L 27/146; H01L 27/1461; H01L 27/1462; H01L 27/1463
See application file for complete search history.

(56) References Cited

U.S. PATENT DOCUMENTS

| | | | |
|---|---|---|---|
| 2009/0200622 A1* | 8/2009 | Tai | H01L 27/14621 257/432 |
| 2012/0267743 A1* | 10/2012 | Nakamura et al. | 257/432 |
| 2013/0134536 A1* | 5/2013 | Mori et al. | 257/432 |
| 2014/0152878 A1* | 6/2014 | Ozawa | H01L 27/14621 348/273 |
| 2014/0339615 A1* | 11/2014 | Wang | H01L 27/14621 257/294 |
| 2015/0115382 A1* | 4/2015 | Wu | H01L 27/1464 257/432 |

FOREIGN PATENT DOCUMENTS

JP    WO 2013021541 A1 *   2/2013    ....... H01L 27/14621

* cited by examiner

*Primary Examiner* — Peniel M Gumedzoe
*Assistant Examiner* — Christopher Johnson
(74) *Attorney, Agent, or Firm* — McDermott Will & Emery LLP

(57) ABSTRACT

An image sensor is provided including a substrate, an array of photosensitive units, a grid, a light-tight layer and a plurality of color filters. In the image sensor, the grid has a top surface, and the light-tight layer is disposed on the top surface of the grid. Due to the light-tight layer on the grid, an incident light entering into the grid can be blocked by the light-tight layer, so that the crosstalk effect is reduced significantly. Further, a method for manufacturing the image sensor also provides herein.

17 Claims, 8 Drawing Sheets

IMAGE SENSOR AND METHOD FOR MANUFACTURING THEREOF

BACKGROUND

Field of Invention

The present disclosure relates to an image sensor, and more particularly, to a structure and method for reducing optical crosstalk in an image sensor.

Description of Related Art

In semiconductor technology, an image sensor is used for sensing a volume of exposed light projected towards it to form an image. For converting various photo energy of the light into electrical signals, the image sensor of a semiconductor provides a grid of pixels which may contain photosensitive diodes, reset transistors, source follower transistors, pinned layer photodiodes, and/or transfer transistors. Common types of the pixel grids include a complementary metal-oxide-semiconductor (CMOS) image sensor (CIS), an active-pixel sensor (APS), a passive-pixel sensor and a charged-coupled device (CCD) sensor. These sensors are widely used in various applications such as digital still camera or mobile phone camera devices.

However, the grid of pixels of the image sensors may suffer from crosstalk while incident light targeted for one pixel grid of an image sensor element traverses the neighboring image sensor elements. As a result, a blaze of light having an overflow of electrons may occur due to the undesired light that spread across the adjacent image sensor elements, so as to reduce overall optical sensitivity and result in poor color separation. Accordingly, improvements in structures and methods for fabricating the image sensor continue to be sought.

BRIEF DESCRIPTION OF THE DRAWINGS

The present disclosure can be more fully understood by reading the following detailed description of the various embodiments, with reference made to the accompanying drawings as follows.

DETAILED DESCRIPTION

Figure 1:
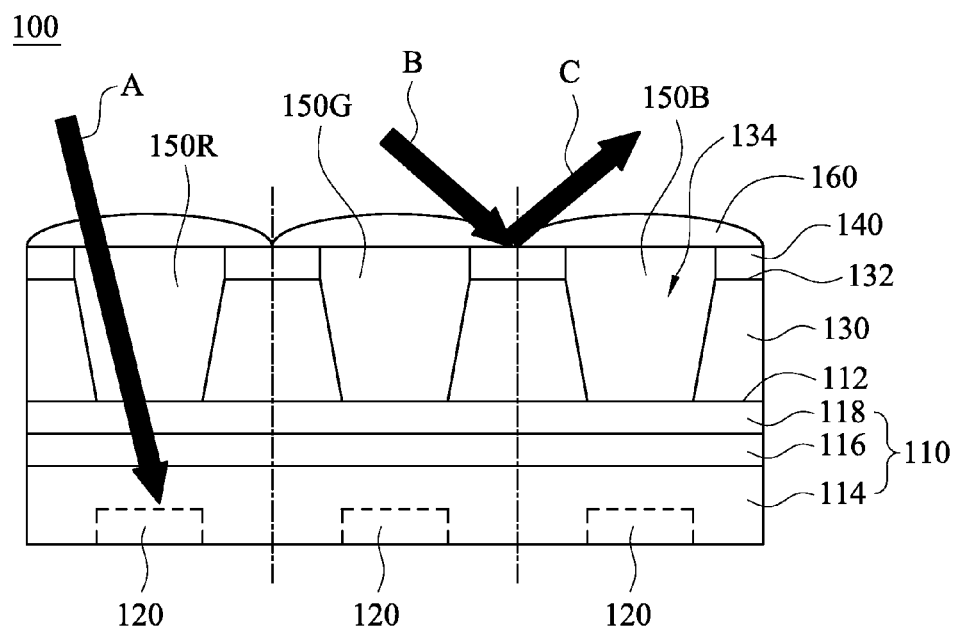
FIGS. 1-8 are schematic cross-sectional views of image sensors according to various embodiments of the present disclosure.

The embodiments of image sensors and a method for manufacturing the same of the present disclosure are discussed in detail below, but not limited the scope of the present disclosure. The same symbols or numbers are used to the same or similar portion in the drawings or the description. The applications of the present disclosure are not limited by the following embodiments and examples which the person in the art can apply in the related field.

The singular forms "a," "an" and "the" used herein include plural referents unless the context clearly dictates otherwise. Therefore, reference to, for example, a light-tight layer includes embodiments having two or more such light-tight layers, unless the context clearly indicates otherwise. Reference throughout this specification to "one embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, the figures are intended; rather, these figures are intended for illustration.

FIG. 1 is a schematic cross-sectional view of an image sensor 100 according to various embodiments of the present disclosure. In FIG. 1, the image sensor 100 includes a substrate 110, an array of photosensitive units 120, a grid 130, a light-tight layer 140, a plurality of color filters 150R, 150G and 150B and a plurality of micro-lenses 160.

The substrate 110 includes a semiconductor substrate 114, an anti-reflective layer 116 and a buffer layer 118. The anti-reflective layer 116 is disposed on the semiconductor substrate 114, and the buffer layer 118 is disposed on the anti-reflective layer 116. According to various embodiments of the present disclosure, the semiconductor substrate 114 is a silicon substrate. According to various embodiments of the present disclosure, the material of the anti-reflective layer 116 is a high-K material including hafnium oxide ($HfO_2$), tantalum oxide ($Ta_2O_5$), zirconium oxide ($ZrO_2$) or aluminum oxide ($Al_2O_3$). According to various embodiments of the present disclosure, the material of the buffer layer 118 is a dielectric material including silicon oxide (SiO), silicon nitride (SiN) or silicon oxynitride (SiON).

The array of photosensitive units 120 is disposed within the substrate 110. More particularly, the array of photosensitive units 120 is disposed within the semiconductor substrate 114 of the substrate 110.

In FIG. 1, the substrate 110 has a surface 112, and the grid 130 is disposed on the surface 112 of the substrate 110. The grid 130 has a top surface 132 and a plurality of openings 134. The openings 134 are individually aligned to the photosensitive units 120. According to various embodiments of the present disclosure, the material of the grid 130 is a dielectric material including silicon oxide (SiO), silicon nitride (SiN) or silicon oxynitride (SiON).

The light-tight layer 140 is disposed on the top surface 132 of the grid 130. According to various embodiments of the present disclosure, the material of the light-tight layer 140 is a high-refractive-index material, a metal, a metal oxide or the combination thereof. In one embodiment of the present disclosure, the material of the light-tight layer 140 is the metal including titanium (Ti), tungsten (W), aluminum (Al), copper (Cu) and the combination thereof. In another embodiment of the present disclosure the material of the light-tight layer 140 is the high-refractive-index material including silicon carbide (SiC), silicon cyanide (SiCN), tantalum nitride (TaN), titanium nitride (TiN) and the combination thereof.

The color filters 150R, 150G and 150B are individually disposed within the openings 134 of the grid 130 and individually aligned to the photosensitive units 120. In FIG. 1, the color filters 150R, 150G and 150B contact the substrate 110, and more particularly, the color filters 150R, 150G and 150B contact the buffer layer 118 of the substrate 110. In various embodiments of the present disclosure, the color filter 150R is a red color filter, the color filter 150G is a green color filter, and the color filter 150B is a blue color filter. In various embodiments of the present disclosure, the light-tight layer 140 and the color filters 150R, 150G and 150B has a planarized co-plane.

The micro-lenses 160 are disposed on the light-tight layer 140 and the color filters 150R, 150G and 150B. More particularly, the micro-lenses 160 are disposed on the planarized co-plane composed of the light-tight layer 140 and the color filters 150R, 150G and 150B.

Referring to FIG. 1, an incident light A enters into one of the photosensitive units 120 through the color filter 150R. However, in various embodiments of the present disclosure, an incident light B is blocked and reflected by the light-tight layer 140, and a reflective light C goes away from the image sensor 100, so that the incident light B cannot occur crosstalk resulting in poor color separation.

Figure 2:
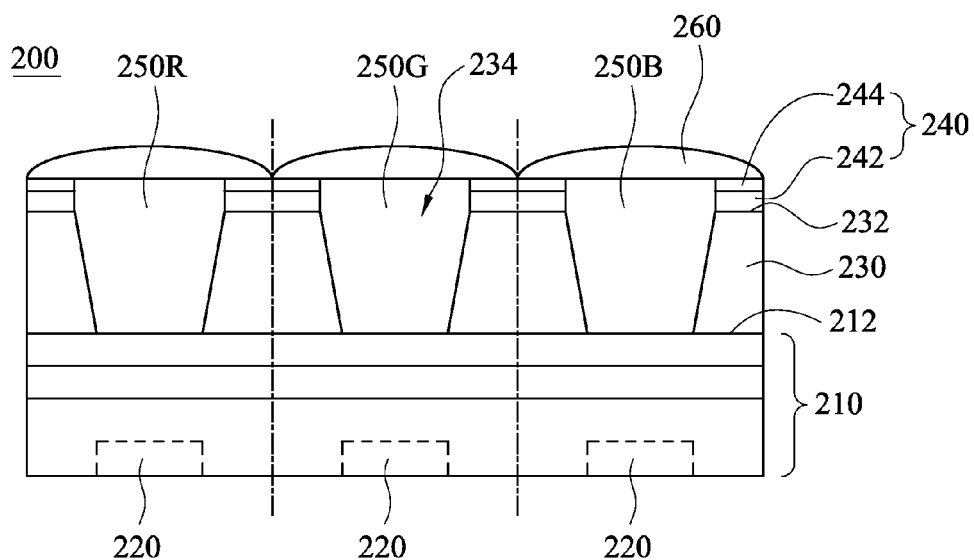

FIG. 2 is a schematic cross-sectional view of an image sensor 200 according to various embodiments of the present disclosure. In FIG. 2, the image sensor 200 includes a substrate 210, an array of photosensitive units 220, a grid 230, a light-tight layer 240, a plurality of color filters 250R, 250G and 250B and a plurality of micro-lenses 260.

In FIG. 2, the array of photosensitive units 220 is disposed within the substrate 210. The substrate 210 has a surface 212, and the grid 230 is disposed on the surface 212 of the substrate 210. The grid 230 has a top surface 232 and a plurality of openings 234. The openings 234 are individually aligned to the photosensitive units 220. The light-tight layer 240 is disposed on the top surface 232 of the grid 230.

The color filters 250R, 250G and 250B are individually disposed within the openings 234 of the grid 230 and individually aligned to the photosensitive units 220. In FIG. 2, the color filters 250R, 250G and 250B contact the substrate 210. In various embodiments of the present disclosure, the light-tight layer 240 and the color filters 250R, 250G and 250B has a planarized co-plane.

The micro-lenses 260 are disposed on the light-tight layer 240 and the color filters 250R, 250G and 250B. More particularly, the micro-lenses 260 are disposed on the planarized co-plane composed of the light-tight layer 240 and the color filters 250R, 250G and 250B.

Different from the image sensor 100 in FIG. 1, the light-tight layer 240 of the image sensor 200 is a multi-layer structure composed of a first light-tight material sub-layer 242 and a second light-tight material sub-layer 244, wherein the second light-tight material sub-layer 244 is disposed on the first light-tight material sub-layer 242. According to various embodiments of the present disclosure, the first light-tight material and the second light-tight material are selected from the group consisting of a high-refractive-index material, a metal, a metal oxide and the combination thereof. In one embodiment of the present disclosure, the first light-tight material, the second light-tight material or the both are the metal including titanium (Ti), tungsten (W), aluminum (Al), copper (Cu) and the combination thereof. In another embodiment of the present disclosure the first light-tight material, the second light-tight material or the both are the high-refractive-index material including silicon carbide (SiC), silicon cyanide (SiCN), tantalum nitride (TaN), titanium nitride (TiN) and the combination thereof.

Figure 3:
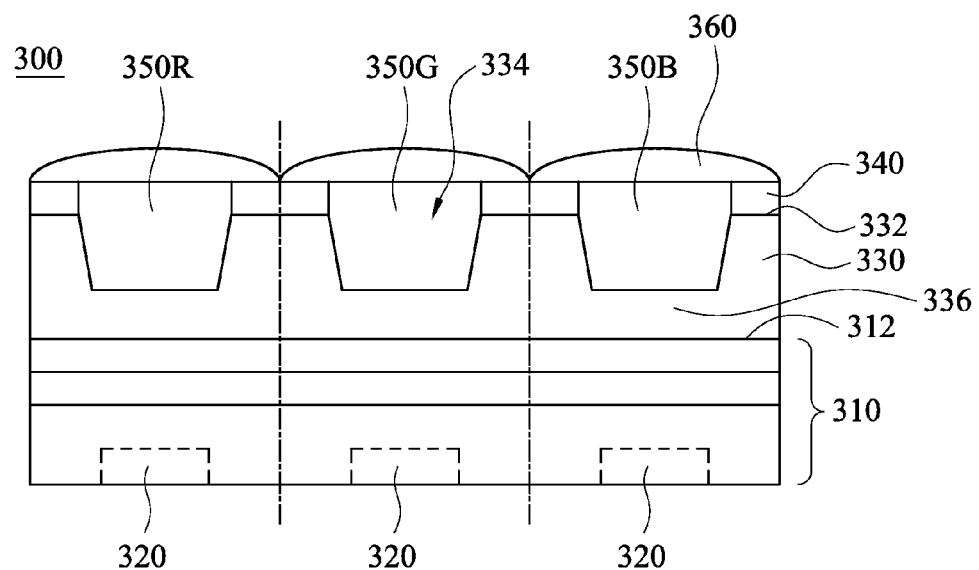

FIG. 3 is a schematic cross-sectional view of an image sensor 300 according to various embodiments of the present disclosure. In FIG. 3, the image sensor 300 includes a substrate 310, an array of photosensitive units 320, a grid 330, a light-tight layer 340, a plurality of color filters 350R, 350G and 350B and a plurality of micro-lenses 360.

In FIG. 3, the array of photosensitive units 320 is disposed within the substrate 310. The substrate 310 has a surface 312, and the grid 330 is disposed on the surface 312 of the substrate 310. The grid 330 has a top surface 332 and a plurality of openings 334. The openings 334 are individually aligned to the photosensitive units 320. The light-tight layer 340 is disposed on the top surface 332 of the grid 330.

The color filters 350R, 350G and 350B are individually disposed within the openings 334 of the grid 330 and individually aligned to the photosensitive units 320. In various embodiments of the present disclosure, the light-tight layer 340 and the color filters 350R, 350G and 350B has a planarized co-plane.

The micro-lenses 360 are disposed on the light-tight layer 340 and the color filters 350R, 350G and 350B. More particularly, the micro-lenses 360 are disposed on the planarized co-plane composed of the light-tight layer 340 and the color filters 350R, 350G and 350B.

Different from the image sensor 100 in FIG. 1, the grid 330 of the image sensor 300 has a grid layer 336 sandwiched between the substrate 310 and the color filters 350R, 350G and 350B. The material of the grid layer 336 is same as the material of the grid 330.

Figure 4:
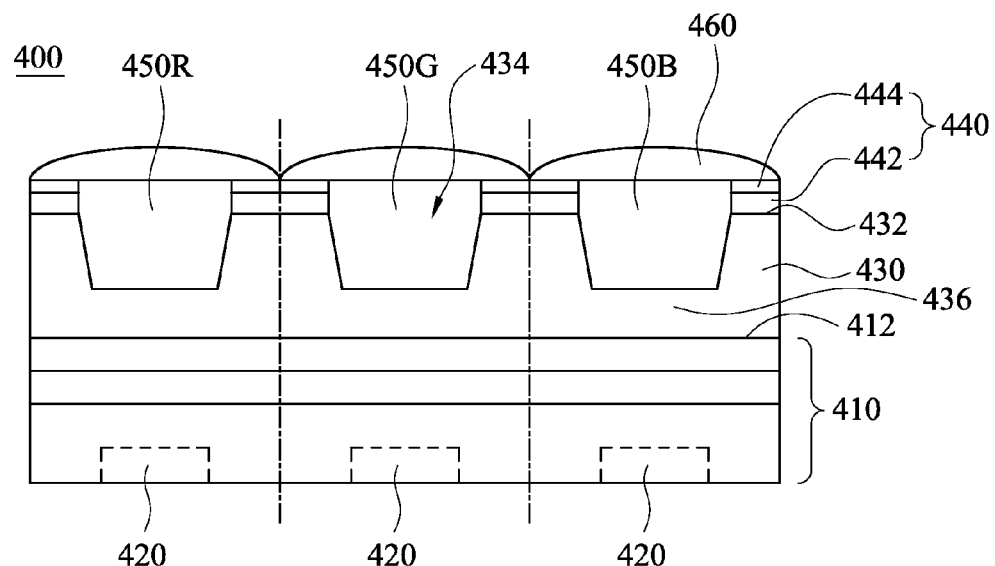

FIG. 4 is a schematic cross-sectional view of an image sensor 400 according to various embodiments of the present disclosure. In FIG. 4, the image sensor 400 includes a substrate 410, an array of photosensitive units 420, a grid 430, a light-tight layer 440, a plurality of color filters 450R, 450G and 450B and a plurality of micro-lenses 460.

In FIG. 4, the array of photosensitive units 420 is disposed within the substrate 410. The substrate 410 has a surface 412, and the grid 430 is disposed on the surface 412 of the substrate 410. The grid 430 has a top surface 432 and a plurality of openings 434. The openings 434 are individually aligned to the photosensitive units 420. The light-tight layer 440 is disposed on the top surface 432 of the grid 430. The light-tight layer 440 is a multi-layer structure composed of a first light-tight material sub-layer 442 and a second light-tight material sub-layer 444, wherein the second light-tight material sub-layer 444 is disposed on the first light-tight material sub-layer 442.

The color filters 450R, 450G and 450B are individually disposed within the openings 434 of the grid 430, and individually aligned to the photosensitive units 420. In FIG. 4, the color filters 450R, 450G and 450B contact the substrate 410. In various embodiments of the present disclosure, the light-tight layer 440 and the color filters 450R, 450G and 450B has a planarized co-plane.

The micro-lenses 460 are disposed on the light-tight layer 440 and the color filters 450R, 450G and 450B. More particularly, the micro-lenses 460 are disposed on the planarized co-plane composed of the light-tight layer 440 and the color filters 450R, 450G and 450B.

Different from the image sensor 200 in FIG. 2, the grid 430 of the image sensor 400 has a grid layer 436 sandwiched between the substrate 410 and the color filters 450R, 450G and 450B. The material of the grid layer 436 is same as the material of the grid 430.

Figure 5:
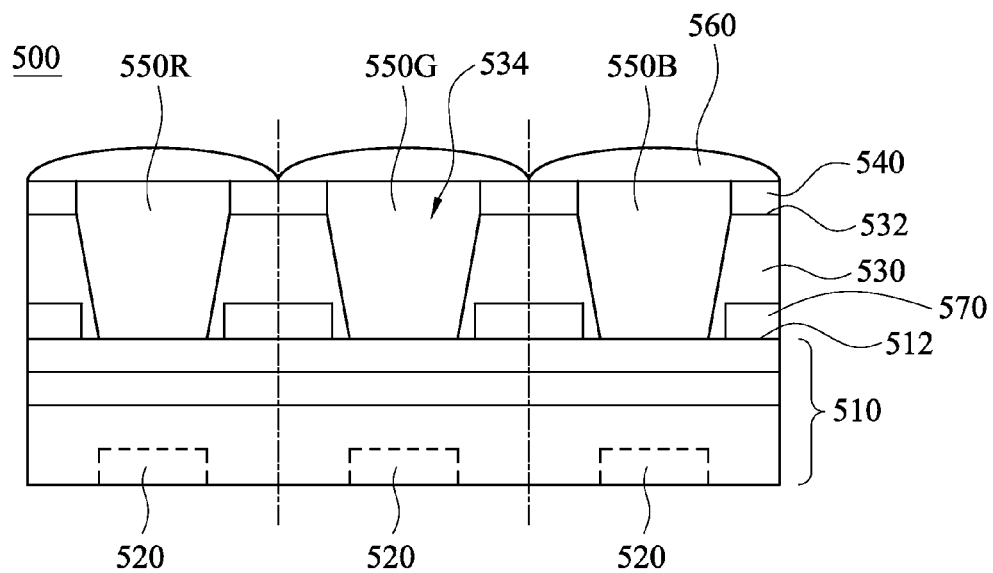

FIG. 5 is a schematic cross-sectional view of an image sensor 500 according to various embodiments of the present disclosure. In FIG. 5, the image sensor 500 includes a substrate 510, an array of photosensitive units 520, a first grid 530, a second grid 570, a light-tight layer 540, a plurality of color filters 550R, 550G and 550B and a plurality of micro-lenses 560.

In FIG. 5, the array of photosensitive units 520 is disposed within the substrate 510. The substrate 510 has a surface 512, and the first grid 530 is disposed on the surface 512 of the substrate 510. The first grid 530 has a top surface 532 and a plurality of first openings 534. The first openings 534 are individually aligned to the photosensitive units 520. The light-tight layer 540 is disposed on the top surface 532 of the first grid 530.

The color filters 550R, 550G and 550B are individually disposed within the first openings 534 of the first grid 530, and individually aligned to the photosensitive units 520. In various embodiments of the present disclosure, the light-tight layer 540 and the color filters 550R, 550G and 550B has a planarized co-plane.

The micro-lenses 560 are disposed on the light-tight layer 540 and the color filters 550R, 550G and 550B. More particularly, the micro-lenses 560 are disposed on the planarized co-plane composed of the light-tight layer 540 and the color filters 550R, 550G and 550B.

Different from the image sensor 100 in FIG. 1, the image sensor 500 further includes a second grid 570. The second grid 570 is disposed on the surface 512 of the substrate 510, and then the first grid 530 covers the second grid 570. The second grid 570 have a plurality of second openings, and the second openings are individually aligned to the first openings 534. According to various embodiments of the present disclosure, the material of the second grid 570 is a metal grid, and the metal includes titanium (Ti), tungsten (W), aluminum (Al), copper (Cu) and the combination thereof.

Figure 6:
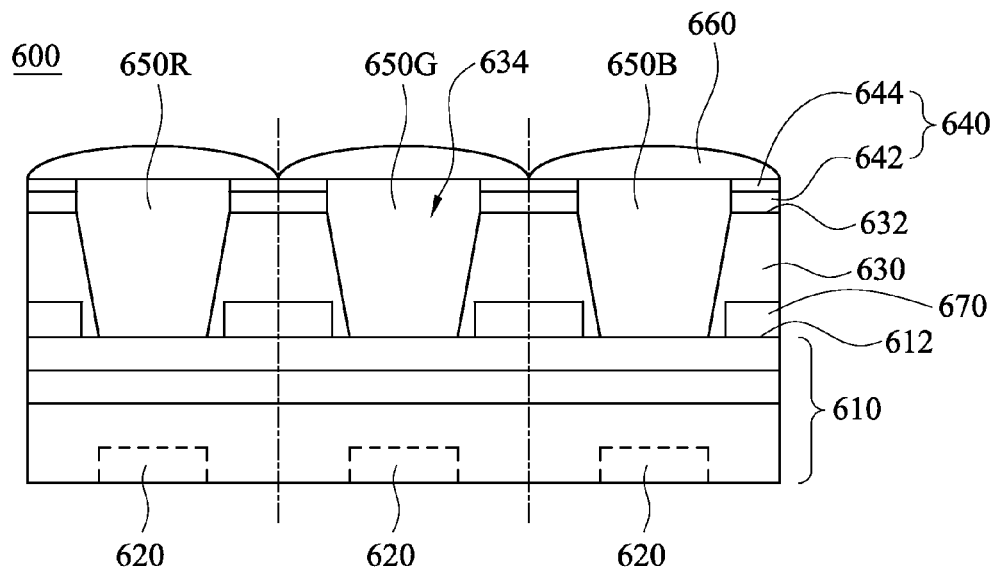

FIG. 6 is a schematic cross-sectional view of an image sensor 600 according to various embodiments of the present disclosure. In FIG. 6, the image sensor 600 includes a substrate 610, an array of photosensitive units 620, a first grid 630, a second grid 670, a light-tight layer 640, a plurality of color filters 650R, 650G and 650B and a plurality of micro-lenses 660.

In FIG. 6, the array of photosensitive units 620 is disposed within the substrate 610. The substrate 610 has a surface 612, and the first grid 630 is disposed on the surface 612 of the substrate 610. The first grid 630 has a top surface 632 and a plurality of first openings 634. The first openings 634 are individually aligned to the photosensitive units 620. The light-tight layer 640 is disposed on the top surface 632 of the first grid 630. The second grid 670 is disposed on the surface 612 of the substrate 610, and then the first grid 630 covers the second grid 670. The second grid 670 have a plurality of second openings, and the second openings are individually aligned to the first openings 634.

The color filters 650R, 650G and 650B are individually disposed within the first openings 634 of the first grid 630, and individually aligned to the photosensitive units 620. In various embodiments of the present disclosure, the light-tight layer 640 and the color filters 650R, 650G and 650B has a planarized co-plane.

The micro-lenses 660 are disposed on the light-tight layer 640 and the color filters 650R, 650G and 650B. More particularly, the micro-lenses 660 are disposed on the planarized co-plane composed of the light-tight layer 640 and the color filters 650R, 650G and 650B.

Different from the image sensor 500 in FIG. 5, the light-tight layer 640 of the image sensor 600 is a multi-layer structure composed of a first light-tight material sub-layer 642 and a second light-tight material sub-layer 644, wherein the second light-tight material sub-layer 644 is disposed on the first light-tight material sub-layer 642.

Figure 7:
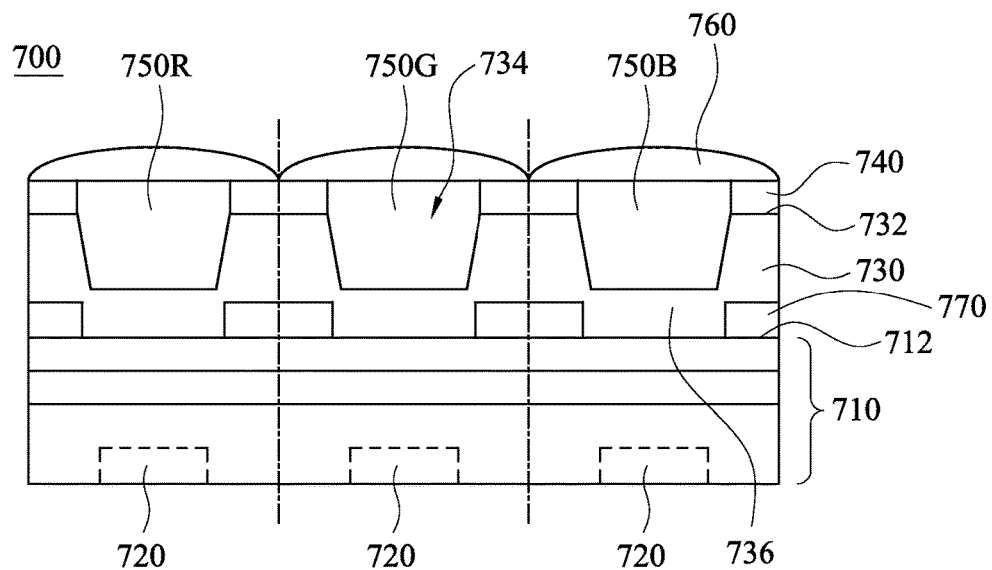

FIG. 7 is a schematic cross-sectional view of an image sensor 700 according to various embodiments of the present disclosure. In FIG. 7, the image sensor 700 includes a substrate 710, an array of photosensitive units 720, a first grid 730, a second grid 770, a light-tight layer 740, a plurality of color filters 750R, 750G and 750B and a plurality of micro-lenses 760.

In FIG. 7, the array of photosensitive units 720 is disposed within the substrate 710. The substrate 710 has a surface 712, and the first grid 730 is disposed on the surface 712 of the substrate 710. The first grid 730 has a top surface 732 and a plurality of first openings 734. The first openings 734 are individually aligned to the photosensitive units 720. The light-tight layer 740 is disposed on the top surface 732 of the first grid 730. The second grid 770 is disposed on the surface 712 of the substrate 710, and then the first grid 730 covers the second grid 770. The second grid 770 have a plurality of second openings, and the second openings are individually aligned to the first openings 734.

The color filters 750R, 750G and 750B are individually disposed within the first openings 734 of the first grid 730, and individually aligned to the photosensitive units 720. In various embodiments of the present disclosure, the light-tight layer 740 and the color filters 750R, 750G and 750B has a planarized co-plane.

The micro-lenses 760 are disposed on the light-tight layer 740 and the color filters 750R, 750G and 750B. More particularly, the micro-lenses 760 are disposed on the planarized co-plane composed of the light-tight layer 740 and the color filters 750R, 750G and 750B.

Different from the image sensor 500 in FIG. 5, the grid 730 of the image sensor 700 has a first grid layer 736 sandwiched between the substrate 710 and the color filters 750R, 750G and 750B. The material of the first grid layer 736 is same as the material of the first grid 730.

Figure 8:
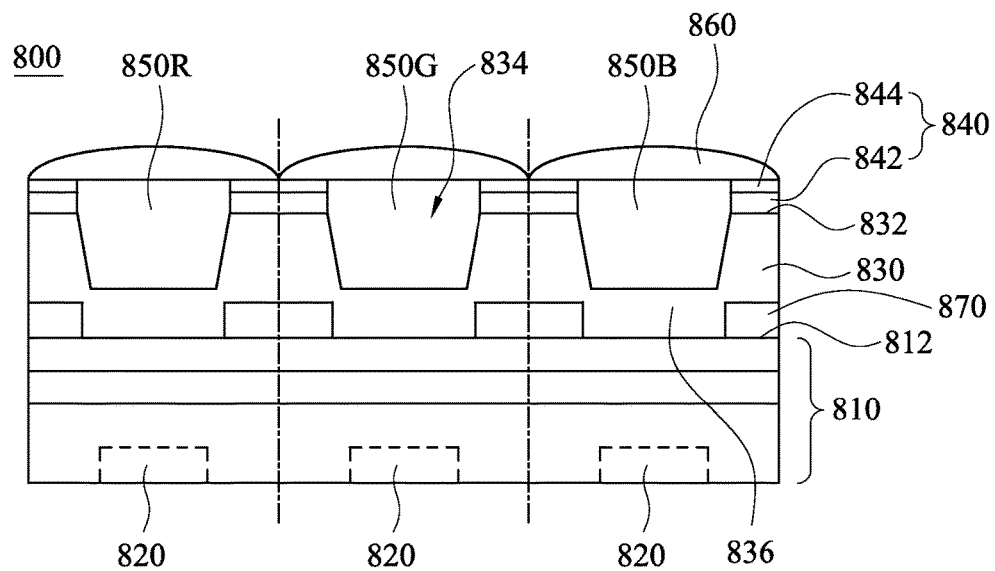

FIG. 8 is a schematic cross-sectional view of an image sensor 800 according to various embodiments of the present disclosure. In FIG. 8, the image sensor 800 includes a substrate 810, an array of photosensitive units 820, a first grid 830, a second grid 870, a light-tight layer 840, a plurality of color filters 850R, 850G and 850B and a plurality of micro-lenses 860.

In FIG. 8, the array of photosensitive units 820 is disposed within the substrate 810. The substrate 810 has a surface 812, and the first grid 830 is disposed on the surface 812 of the substrate 810. The first grid 830 has a top surface 832 and a plurality of first openings 834. The first openings 834 are individually aligned to the photosensitive units 820. The second grid 870 is disposed on the surface 812 of the substrate 810, and then the first grid 830 covers the second grid 870. The second grid 870 have a plurality of second openings, and the second openings are individually aligned to the first openings 834.

The light-tight layer 840 is disposed on the top surface 832 of the first grid 830. The light-tight layer 840 is a multi-layer structure composed of a first light-tight material sub-layer 842 and a second light-tight material sub-layer 844, wherein the second light-tight material sub-layer 844 is disposed on the first light-tight material sub-layer 842.

The color filters 850R, 850G and 850B are individually disposed within the first openings 834 of the first grid 830, and individually aligned to the photosensitive units 820. In various embodiments of the present disclosure, the light-tight layer 840 and the color filters 850R, 850G and 850B has a planarized co-plane.

The micro-lenses 860 are disposed on the light-tight layer 840 and the color filters 850R, 850G and 850B. More particularly, the micro-lenses 860 are disposed on the planarized co-plane composed of the light-tight layer 840 and the color filters 850R, 850G and 850B.

Different from the image sensor 600 in FIG. 6, the grid 830 of the image sensor 800 has a first grid layer 836 sandwiched between the substrate 810 and the color filters 850R, 850G and 850B. The material of the first grid layer 836 is same as the material of the first grid 830.

FIGS. 9A-9G are schematic cross-sectional views at various stages of a method for fabricating an image sensor 900 according to various embodiments of the present disclosure. The method is able to locally repair all types of aforementioned issues, so as to avoid the crosstalk occurring in the image sensor according to various embodiments of the present disclosure.

Figure 9A:
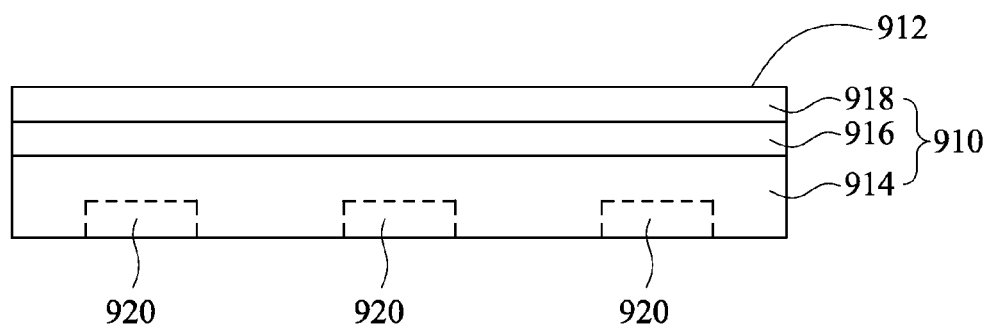
FIGS. 9A-9G are schematic cross-sectional views at various stages of fabricating an image sensor according to various embodiments of the present disclosure.

In FIG. 9A, a substrate 910 is provided. The substrate 910 has a surface 912, and includes a semiconductor substrate 914, an anti-reflective layer 916 and a buffer layer 918. The anti-reflective layer 916 is formed on the semiconductor substrate 914. In various embodiments of the present disclosure, forming the anti-reflective layer 916 is conducted by using a furnace or performing a sputtering process. In various embodiments of the present disclosure, the anti-reflective layer 916 is formed of a high-K material including hafnium oxide ($HfO_2$), tantalum oxide ($Ta_2O_5$), zirconium oxide ($ZrO_2$) or aluminum oxide ($Al_2O_3$).

The buffer layer 918 is formed on the anti-reflective layer 916. In various embodiments of the present disclosure, forming the buffer layer 918 is by performing physical vapor deposition (PVD), chemical vapor deposition (CVD), atomic layer deposition (ALD) or plasma-enhanced chemical vapor deposition (PECVD). In various embodiments of the present disclosure, the buffer layer 918 is formed of a dielectric material including silicon oxide (SiO), silicon nitride (SiN) or silicon oxynitride (SiON).

Referring to FIG. 9A, an array of photosensitive units 920 is formed within the substrate 910. More particularly, the array of photosensitive units 920 is formed within the semiconductor substrate 914 of the substrate 910.

Figure 9B:
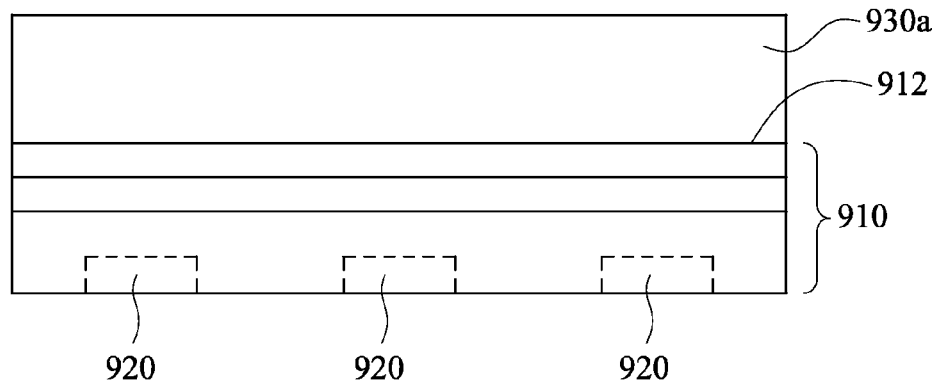

In FIG. 9B, a first grid layer 930a is formed on the surface 912 of the substrate 910. In various embodiments of the present disclosure, forming the first grid layer 930a includes forming a dielectric material layer. The dielectric material includes silicon oxide (SiO), silicon nitride (SiN) or silicon oxynitride (SiON). In various embodiments of the present disclosure, the first grid layer 930a is by performing physical vapor deposition (PVD), chemical vapor deposition (CVD), atomic layer deposition (ALD) or plasma-enhanced chemical vapor deposition (PECVD).

In some cases, a second grid layer is formed on the substrate, and then the second grid layer is patterned to form a second grid. The second grid has a plurality of third openings, and third openings are individually aligned to the photosensitive units. The first grid layer is sequentially formed on the second grid. In various embodiments of the present disclosure, forming the second grid layer includes forming a metal layer. In various embodiments of the present disclosure, the second grid is formed of a metal including titanium (Ti), tungsten (W), aluminum (Al), copper (Cu) and the combination thereof. In various embodiments of the present disclosure, the second grid layer is formed by performing a sputtering process, a plating process or an evaporation process, and then patterned by performing an etching process to form the second grid.

Figure 9C:
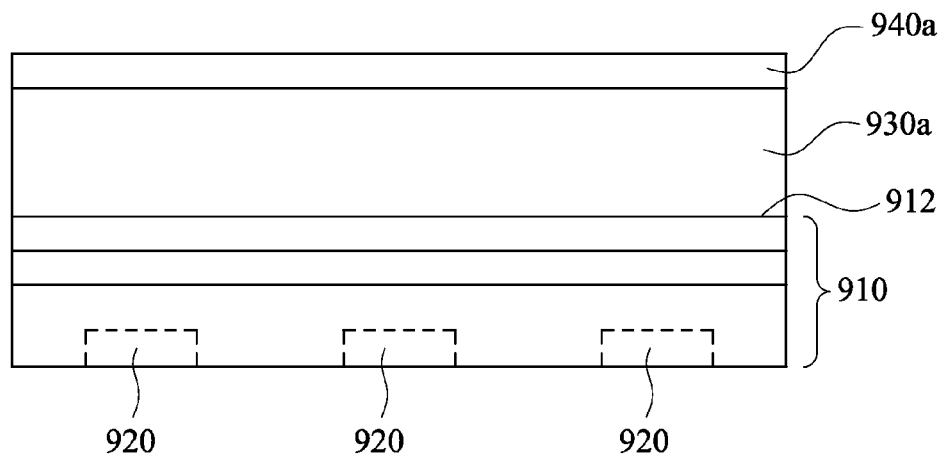

Referring to FIG. 9C, a light-tight material layer 940a is formed on the first grid layer 930a. In various embodiments of the present disclosure, forming the light-tight material layer 940a is forming a high-refractive-index material layer, a metal layer, a metal oxide layer or the combination thereof. The high-refractive-index material includes silicon carbide (SiC), silicon cyanide (SiCN), tantalum nitride (TaN), titanium nitride (TiN) and the combination thereof. And, the metal includes titanium (Ti), tungsten (W), aluminum (Al), copper (Cu) and the combination thereof. In various embodiments of the present disclosure, the light-tight material layer 940a is by performing a sputtering process, a plating process or an evaporation process. In some cases, the light-tight material layer 940a is formed to be a multi-layer structure, and the multi-layer structure is formed of a plurality of light-tight material sub-layers.

Figure 9D:
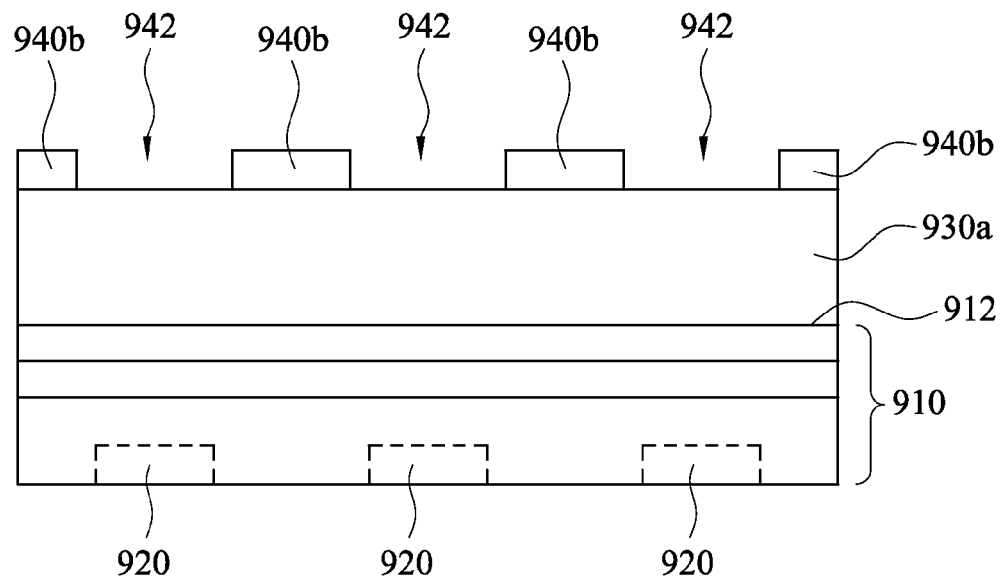

Referring to FIG. 9D, the light-tight material layer 940a in FIG. 9C is patterned to form a light-tight layer 940b. The light-tight layer 940b has a plurality of first openings 942, wherein the first openings 942 are individually aligned to the photosensitive units 920. In various embodiments of the present disclosure, patterning the light-tight material layer 940a is performing an etching process to the light-tight material layer 940a. More particularly, the light-tight layer 940b is by performing a dry-etching process.

Figure 9E:
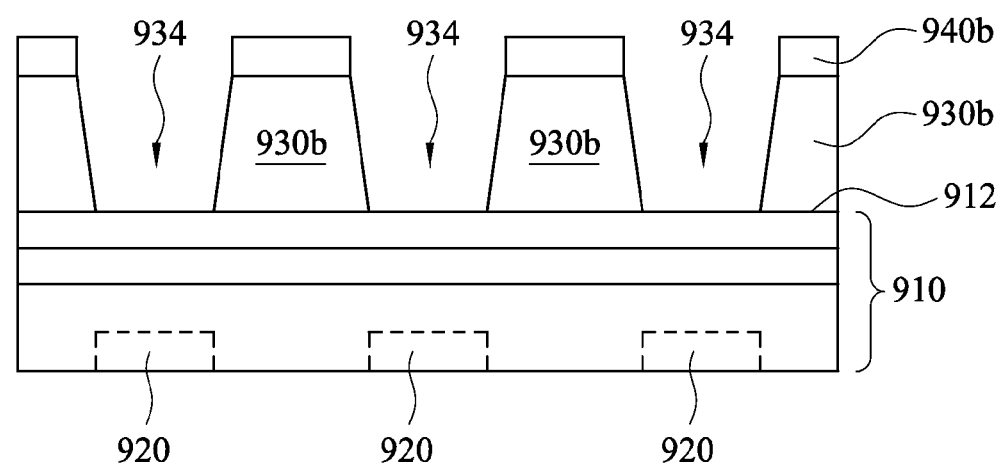

Referring to FIG. 9E, the first grid layer 930a in FIG. 9D is patterned to remove portions of the first grid layer 930a aligned to the first openings 942, and then a first grid 930b is formed and has a plurality of second openings 934. In various embodiments of the present disclosure, the light-tight layer 940b is formed as a hard mask for patterning the first grid layer in an etching process. In various embodiments of the present disclosure, the first grid 930b is by performing a dry-etching process or a wet-etching process. Because the first openings 942 of the light-tight layer 940b are individually aligned to the photosensitive units 920, the second openings 934 of the first grid 930b are also individually aligned to the photosensitive units 920. In some cases, parts of the surface 912 of the substrate 910 may be exposed after the formation of the first grid 930b. In other cases, there is a residue layer of the first grid layer 930a covering the surface 912 of the substrate 910 after the formation of the first grid 930b.

Figure 9F:
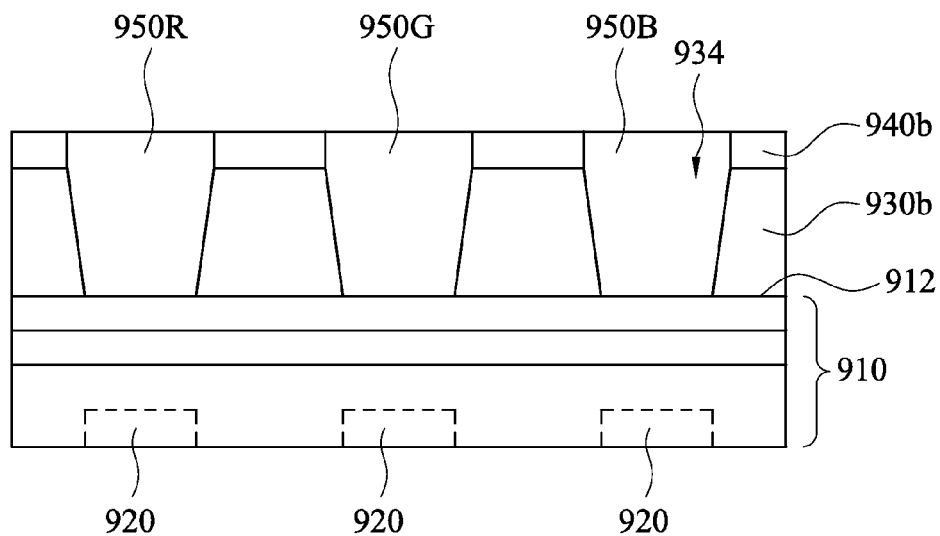

In FIG. 9F, a plurality of color filter materials are filled into the second openings 934 of the first grid 930b to form an array of color filters 950R, 950G and 950B. Because the second openings 934 of the first grid 930b are individually aligned to the photosensitive units 920, the color filters 950R, 950G and 950B are also individually aligned to the photosensitive units 920. In some cases, the color filters 950R, 950G and 950B contact the surface 912 of the substrate 910 after filling the color filter materials into the second openings 934. In other cases, there is a residue layer of the first grid layer 930a between the substrate 910 and the color filters 950R, 950G and 950B. In various embodiments of the present disclosure, the color filters 950R, 950G and 950B is formed by performing chemical vapor deposition (CVD). In various embodiments of the present disclosure, a planarized co-plane is formed on the light-tight layer 940b and the color filters 950R, 950G and 950B.

Figure 9G:
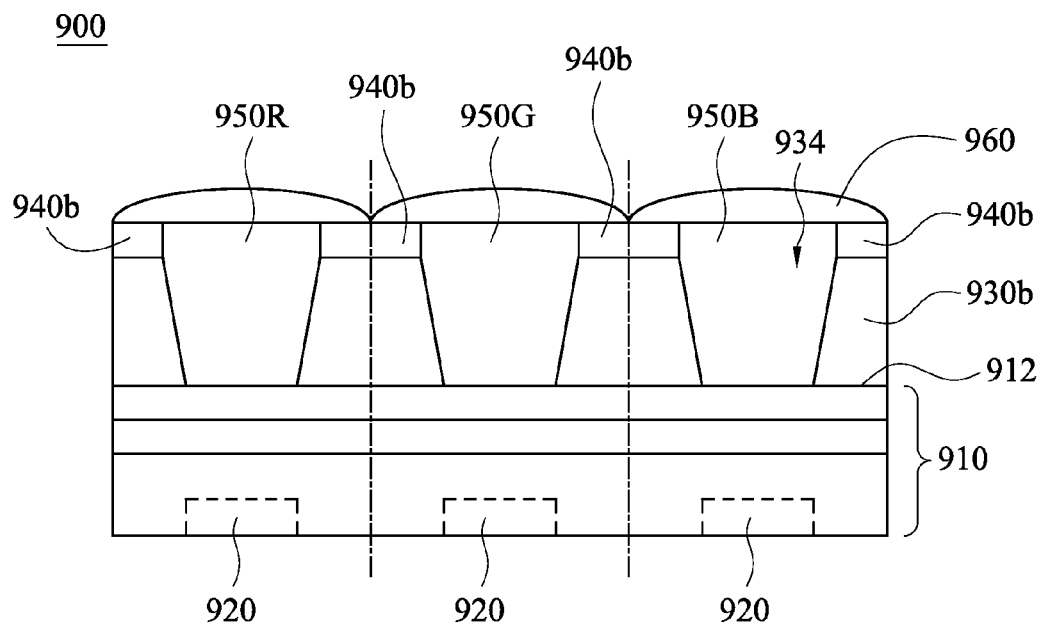

In various embodiments of the present disclosure, a plurality of micro-lenses 960 are formed on the light-tight layer 940b and the color filters 950R, 950G and 950B, referring to FIG. 9G. More particularly, the micro-lenses 960 are formed on the planarized co-plane composed of the light-tight layer 940b and the color filters 950R, 950G and 950B, and are individually aligned to the photosensitive units 920. In FIG. 9G, an image sensor 900 is then formed by the fabricating method including the various stages from FIGS. 9A to 9G.

Figure 10:
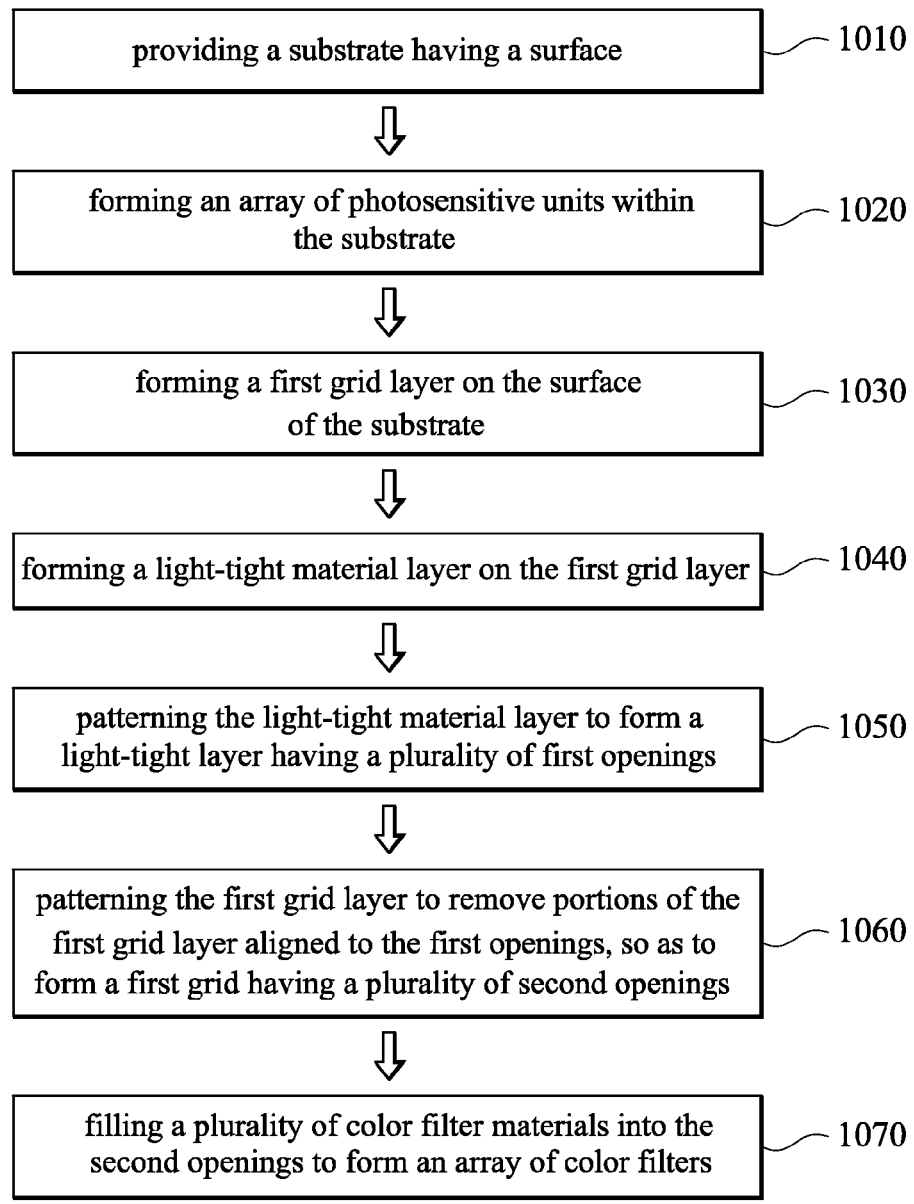
FIG. 10 is a flow chart illustrating a method of manufacturing an image sensor according to various embodiments of the present disclosure.

FIG. 10 is a flow chart illustrating a method of manufacturing an image sensor according to various embodiments of the present disclosure. The operations 1010 to 1070 are disclosed in association with the cross-sectional views of the image sensor 900 from FIGS. 9A to 9G at various fabrication stages.

In the operation 1010, the substrate 910 is provided. Referring to FIG. 9A, the substrate 910 has the surface 912, and includes the semiconductor substrate 914, the anti-reflective layer 916 and the buffer layer 918. The anti-reflective layer 916 is formed on the semiconductor substrate 914, and the buffer layer 918 is formed on the anti-reflective layer 916.

Still referring to the operation 1020, the array of photosensitive units 920 is formed within the substrate 910. More particularly, the array of photosensitive units 920 is formed within the semiconductor substrate 914 of the substrate 910.

In the operation 1030, the first grid layer 930*a* is formed on the surface 912 of the substrate 910. Referring to FIG. 9B, the first grid layer 930*a* is formed of a dielectric material. The dielectric material includes silicon oxide (SiO), silicon nitride (SiN) or silicon oxynitride (SiON). In various embodiments of the present disclosure, the first grid layer 930*a* is by performing physical vapor deposition (PVD), chemical vapor deposition (CVD), atomic layer deposition (ALD) or plasma-enhanced chemical vapor deposition (PECVD).

According to various embodiments of the present disclosure, the fabricating method further includes forming a second grid layer on the substrate and patterning the second grid layer to form a second grid. The second grid has a plurality of third openings, and third openings are individually aligned to the photosensitive units. The first grid layer is sequentially formed on the second grid.

In various embodiments of the present disclosure, the second grid is formed of a metal including titanium (Ti), tungsten (W), aluminum (Al), copper (Cu) and the combination thereof. In various embodiments of the present disclosure, the second grid layer is formed by performing a sputtering process, a plating process or an evaporation process, and then patterned by performing an etching process to form the second grid.

In the operation 1040, a light-tight material layer 940*a* is formed on the first grid layer 930*a*. Referring to FIG. 9C, the light-tight material layer 940*a* is formed of a high-refractive-index material, a metal, a metal oxide or the combination thereof. The high-refractive-index material includes silicon carbide (SiC), silicon cyanide (SiCN), tantalum nitride (TaN), titanium nitride (TiN) and the combination thereof. And, the metal includes titanium (Ti), tungsten (W), aluminum (Al), copper (Cu) and the combination thereof.

In various embodiments of the present disclosure, the light-tight material layer 940*a* is by performing a sputtering process, a plating process or an evaporation process. In some cases, the light-tight material layer 940*a* is formed to be a multi-layer structure, and the multi-layer structure is formed of a plurality of light-tight material sub-layers.

In the operation 1050, the light-tight material layer 940*a* is patterned to form a light-tight layer 940*b*. Referring to FIG. 9D, the light-tight layer 940*b* has a plurality of first openings 942, wherein the first openings 942 are individually aligned to the photosensitive units 920.

In various embodiments of the present disclosure, the light-tight material layer 940*a* is patterned by performing an etching process to the light-tight material layer 940*a*. More particularly, the light-tight layer 940*b* is patterned by performing a dry-etching process.

In the operation 1060, the first grid layer 930*a* is patterned to remove portions of the first grid layer 930*a* aligned to the first openings 942, and then a first grid 930*b* is formed and has a plurality of second openings 934. Referring to FIG. 9E, the light-tight layer 940*b* is formed as a hard mask for patterning the first grid layer in an etching process.

In various embodiments of the present disclosure, the first grid 930*b* is formed by performing a dry-etching process or a wet-etching process. Because the first openings 942 of the light-tight layer 940*b* are individually aligned to the photosensitive units 920, the second openings 934 of the first grid 930*b* are also individually aligned to the photosensitive units 920. In some cases, parts of the surface 912 of the substrate 910 may be exposed after the formation of the first grid 930*b*. In other cases, there is a residue layer of the first grid layer 930*a* covering the surface 912 of the substrate 910 after the formation of the first grid 930*b*.

In the operation 1070, a plurality of color filter materials are filled into the second openings 934 of the first grids 930 to form an array of color filters 950R, 950G and 950B. Because the second openings 934 of the first grid 930*b* are individually aligned to the photosensitive units 920, the color filters 950R, 950G and 950B are also individually aligned to the photosensitive units 920.

Referring to FIG. 7G, the color filters 950R, 950G and 950B contact the surface 912 of the substrate 910 after filling the color filter materials into the second openings 934. In some cases, there is a residue layer of the first grid layer 930*a* between the substrate 910 and the color filters 950R, 950G and 950B. In various embodiments of the present disclosure, the color filters 950R, 950G and 950B is formed by performing chemical vapor deposition (CVD). In various embodiments of the present disclosure, a planarized co-plane is formed on the light-tight layer 940*b* and the color filters 950R, 950G and 950B.

Referring to FIG. 9G, a plurality of micro-lenses 960 are formed on the light-tight layer 940*b* and the color filters 950R, 950G and 950B. More particularly, the micro-lenses 960 are formed on the planarized co-plane composed of the light-tight layer 940*b* and the color filters 950R, 950G and 950B, and are individually aligned to the photosensitive units 920. In FIG. 9G, an image sensor 900 is then formed by the fabricating method including the various stages from FIGS. 9A to 9G.

In accordance with some embodiments, the present disclosure discloses an image sensor including a grid and a light-tight layer. The light-tight layer is located on a top surface of the grid. The light-tight layer can block incident lights targeted for one image sensor element spreads to neighboring image sensor elements, so as to avoid crosstalk occurred.

In accordance with some embodiments, the present disclosure disclosed a method for fabricating an image sensor. In this method, a light-tight material layer is patterned to form a light-tight layer. The light-tight layer may be used as a hard mask for performing an etching process of a grid layer. Therefore, there is no need to perform an additionally lithographic process for etching the grid layer. The grid layer can be directly performed a dry-etching process or a wet-etching process while the light-tight layer is as the hard mask.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An image sensor, comprising:
a substrate having a surface;
an array of photosensitive units disposed within the substrate;
a grid disposed on the surface of the substrate, the grid having a top surface and a plurality of openings, wherein the openings are individually aligned to the photosensitive units;
a light-blocking metal layer disposed on the top surface of the grid; and
a plurality of color filters individually disposed within the openings of the grid and individually aligned to the photosensitive units, and top surfaces of the color filters and a top surface of the light-blocking metal layer being in contact and coplanar.

2. The image sensor of claim 1, wherein the material of the grid is a dielectric material.

3. The image sensor of claim 2, wherein the dielectric material is silicon oxide (SiO), silicon nitride (SiN), silicon oxynitride (SiON) or the combination thereof.

4. The image sensor of claim 1, wherein the light-blocking metal layer is a multi-layer structure.

5. The image sensor of claim 1, wherein the light-blocking metal layer is made of one selected from the group consisting of titanium (Ti), tungsten (W), aluminum (Al), copper (Cu) and the combination thereof.

6. An image sensor, comprising:
a substrate having a surface;
an array of photosensitive units disposed within the substrate;
a metal grid disposed on the surface of the substrate, the metal grid having a plurality of first openings, wherein the first openings are individually aligned to the photosensitive units;
a dielectric grid disposed on the surface of the substrate, the dielectric grid having a top surface and a plurality of second openings, wherein the second openings are individually aligned to the first openings, and the metal grid is embedded in the dielectric grid;
a metal layer disposed on the top surface of the dielectric grid; and
a plurality of color filters individually disposed within the second openings of the dielectric grid and individually aligned to the photosensitive units, and top surfaces of the color filters and a top surface of the metal layer being in contact and coplanar.

7. The image sensor of claim 6, wherein the metal grid and the metal layer are individually made of titanium (Ti), tungsten (W), aluminum (Al), copper (Cu) or the combination thereof.

8. The image sensor of claim 6, wherein the dielectric grid is made of silicon oxide (SiO), silicon nitride (SiN), silicon oxynitride (SiON) or the combination thereof.

9. An image sensor, comprising:
a substrate having a surface;
an array of photosensitive units disposed within the substrate;
a first grid disposed on the surface of the substrate, the first grid having a top surface and a plurality of first openings, wherein the first openings are individually aligned to the photosensitive units;
a light-blocking metal layer disposed on the top surface of the first grid;
a plurality of color filters individually disposed within the first openings of the first grid and individually aligned to the photosensitive units, and top surfaces of the color filters and a top surface of the light-blocking metal layer being in contact and coplanar; and
a grid layer sandwiched between the substrate and the color filters.

10. The image sensor of claim 9, wherein the substrate comprises a semiconductor substrate, an anti-reflective layer disposed on the semiconductor substrate and a buffer layer disposed on the anti-reflective layer.

11. The image sensor of claim 10, wherein the semiconductor substrate comprises a silicon substrate.

12. The image sensor of claim 10, wherein the material of the anti-reflective layer is a high-K material comprising hafnium oxide ($HfO_2$), tantalum oxide ($Ta_2O_5$), zirconium oxide ($ZrO_2$) or aluminum oxide ($Al_2O_3$).

13. The image sensor of claim 10, wherein the material of the buffer layer is a dielectric material comprising silicon oxide (SiO), silicon nitride (SiN) or silicon oxynitride (SiON).

14. The image sensor of claim 9, wherein the array of photosensitive units is disposed within a semiconductor substrate of the substrate.

15. The image sensor of claim 9, wherein the material of the grid layer is same as the material of the first grid.

16. The image sensor of claim 9, further comprising a second grid disposed on the surface of the substrate, and covered by the first grid.

17. The image sensor of claim 16, wherein the second grid has a plurality of second openings, and the second openings are individually aligned to the first openings.

* * * * *